(12) United States Patent
Cheng

(10) Patent No.: US 12,414,405 B2
(45) Date of Patent: Sep. 9, 2025

(54) SUBSTRATE STRIPPING METHOD FOR SEMICONDUCTOR STRUCTURE BY IRRADIATING ALGAN

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 192 days.

(21) Appl. No.: 18/024,627

(22) PCT Filed: Oct. 10, 2020

(86) PCT No.: PCT/CN2020/120174
§ 371 (c)(1),
(2) Date: Mar. 3, 2023

(87) PCT Pub. No.: WO2022/073230
PCT Pub. Date: Apr. 14, 2022

(65) Prior Publication Data
US 2023/0317873 A1    Oct. 5, 2023

(51) Int. Cl.
*H10H 20/01* (2025.01)
*H01L 21/02* (2006.01)
(Continued)

(52) U.S. Cl.
CPC ..... *H10H 20/018* (2025.01); *H01L 21/02354* (2013.01); *H01L 21/02507* (2013.01);
(Continued)

(58) Field of Classification Search
CPC ......... H01L 21/02354; H01L 21/02507; H01L 21/0254; H01L 21/2011; H01L 21/76871;
(Continued)

(56) References Cited

U.S. PATENT DOCUMENTS

| 7,897,423 B2 | 3/2011 | Hahn et al. |
| 8,273,593 B2 | 9/2012 | Hahn et al. |

(Continued)

FOREIGN PATENT DOCUMENTS

| CN | 1870312 A | 11/2006 |
| CN | 1943044 A | 4/2007 |

(Continued)

OTHER PUBLICATIONS

Takeuchi, Misaichi, et al., "AlN/AlGaN short-period superlattice sacrificial layers in laser lift-off for vertical-type AlGaN-based deep ultraviolet light emitting diodes", Applied Physics Letters 94, pp. 061117-1-061117-3 (Year: 2009).*

(Continued)

*Primary Examiner* — Fernando L Toledo
*Assistant Examiner* — Ryan T. Fortin
(74) *Attorney, Agent, or Firm* — The Small Patent Law Group LLC; Christopher R. Carroll

(57) ABSTRACT

Provided is a method for stripping a substrate of a semiconductor structure, including: providing a substrate, a first AlN layer, a first AlGaN layer and a function layer from bottom to top; and irradiating the first AlGaN layer from the substrate with laser light to decompose the first AlGaN layer, such that the function layer is separated from the substrate and the first AlN layer.

7 Claims, 3 Drawing Sheets

Laser irradiation

(51) Int. Cl.
  *H01L 21/20* (2006.01)
  *H01L 21/768* (2006.01)
  *H10D 30/47* (2025.01)
  *H10H 20/811* (2025.01)
  *H10H 20/814* (2025.01)
  *H10H 20/824* (2025.01)

(52) U.S. Cl.
  CPC ...... *H01L 21/0254* (2013.01); *H01L 21/2011* (2013.01); *H01L 21/76871* (2013.01); *H10H 20/811* (2025.01); *H10H 20/814* (2025.01); *H10H 20/824* (2025.01); *H10D 30/47* (2025.01)

(58) Field of Classification Search
  CPC . H01L 21/7806; H01L 21/683; H01L 29/778; H01L 33/0093; H01L 33/0025; H01L 33/10; H10H 20/018; H10H 20/811; H10H 20/814; H10H 20/824; H10H 20/0133; H10D 30/47; H03H 9/56
  See application file for complete search history.

(56) References Cited

U.S. PATENT DOCUMENTS

| | | | |
|---|---|---|---|
| 10,622,530 | B2 | 4/2020 | Yamamoto et al. |
| 2007/0139141 | A1 | 6/2007 | Knollenberg et al. |
| 2008/0093611 | A1 | 4/2008 | Hahn et al. |
| 2011/0140141 | A1 | 6/2011 | Hahn et al. |
| 2016/0079468 | A1* | 3/2016 | Gomez-Iglesias ......................... H01L 33/0093 438/29 |
| 2018/0083173 | A1 | 3/2018 | Yamamoto et al. |
| 2018/0374985 | A1* | 12/2018 | Chen ..................... H01L 33/007 |
| 2019/0157500 | A1* | 5/2019 | Cheng ................ H01L 21/7813 |

FOREIGN PATENT DOCUMENTS

| | | |
|---|---|---|
| CN | 107123589 A | 9/2017 |
| CN | 107863426 A | 3/2018 |
| CN | 208352325 U | 1/2019 |
| CN | 109461644 A | 3/2019 |
| CN | 110459659 A | 11/2019 |
| CN | 110931606 A | 3/2020 |
| CN | 107170668 B | 6/2020 |
| KR | 2006-0127623 A * | 12/2006 ............. H01L 33/02 |

OTHER PUBLICATIONS

Karrer, Uwe, et al., "AlGaN-based ultraviolet light detectors with integrated optical filters", Journal of Vacuum Science and Technology B, vol. 18 (2), pp. 757-760 (Year: 2000).*

Zeimer, U., et al., "High quality AlGaN grown on ELO AlN/sapphire templates", Journal of Crystal Growth vol. 377, pp. 32-36 (Year : 2013).*

ISA State Intellectual Property Office of the People's Republic of China, International Search Report Issued in Application No. PCT/CN2020/120174, Jul. 8, 2021, WIPO, 4 pages.

ISA State Intellectual Property Office of the People's Republic of China, Written Opinion of the International Searching Authority Issued in Application No. PCT/CN2020/120174, Jul. 8, 2021, WIPO, 6 pages. (Submitted with Machine/Partial Translation).

State Intellectual Property Office of the People's Republic of China, Office Action and Search Report Issued in Application No. 2020801057960, Feb. 15, 2025, 10 pages. (Submitted with Machine Translation).

* cited by examiner

Laser irradiation

Laser irradiation

Laser irradiation

Laser irradiation

SUBSTRATE STRIPPING METHOD FOR SEMICONDUCTOR STRUCTURE BY IRRADIATING ALGAN

CROSS REFERENCE TO RELATED APPLICATIONS

This application is a US National Phase of a PCT Application No. PCT/CN2020/120174 filed on Oct. 10, 2020, the entire contents of which are incorporated herein by reference in their entireties.

TECHNICAL FIELD

This present disclosure relates to the technical field of semiconductors and in particular, to methods for stripping a substrate of a semiconductor structure.

BACKGROUND

Wide-bandgap semiconductor material, such as GaN-based material, as a typical representative of the third-generation semiconductor materials, has excellent properties of wide band gap, high pressure resistance, high temperature resistance, high electron saturation velocity, high drift velocity and easy formation of a high-quality heterostructure, which is suitable for manufacturing a high temperature, high frequency and high power electronic device.

Due to lack of intrinsic substrates, a GaN-based device are generally manufactured on a heterogeneous substrate, such as a sapphire substrate, a silicon carbide substrate or a silicon substrate.

In recent years, with the market demand for thinner and lighter devices, how to peel off a substrate of a GaN-based device and how to improve the peeling-off quality are technical problems that need to be solved urgently in the industry.

SUMMARY

The object of the present disclosure is to provide a method for stripping a substrate of a semiconductor structure, which can improve the stripping quality and reduce the stripping cost.

In order to achieve the above purpose, the present disclosure provides a method for stripping a substrate of a semiconductor structure including:
  providing a substrate, a first AlN layer, a first AlGaN layer and a function layer from bottom to top; and
  irradiating the first AlGaN layer from the substrate with laser light to decompose the first AlGaN layer, such that the function layer is separated from the substrate and the first AlN layer.

In some embodiments, the method further includes providing a second AlN layer between the first AlGaN layer and the function layer, where after the laser light irradiates the first AlGaN layer from the substrate, the function layer and the second AlN layer are separated from the substrate and the first AlN layer.

In some embodiments, the method further includes providing a second AlGaN layer between the first AlGaN layer and the function layer, where Al composition content in the second AlGaN layer is higher than Al composition content in the first AlGaN layer, and after the laser light irradiates the first AlGaN layer from the substrate, the function layer and the second AlGaN layer are separated from the substrate and the first AlN layer.

It should be noted that the Al composition in the AlGaN layer in the present disclosure refers to the percentage of the amount of Al element in the sum of the amount of Al element and the amount of Ga element, that is, the percentage of the number of Al atoms in the sum of the number of Al atoms and the number of Ga atoms.

In some embodiments, Al component content in the first AlGaN layer is less than 70%.

In some embodiments, the first AlGaN layer is a single-layer structure or a multi-layer structure.

In some embodiments, the multi-layer structure includes first AlGaN sublayers, and Al composition content in each of the first AlGaN sublayers is different.

In some embodiments, the multi-layer structure includes an AlGaN/AlN alternating multi-layer superlattice structure.

In some embodiments, a material of the substrate is sapphire.

In some embodiments, the function layer includes: a light wave filtering structure or an LED structure.

In some embodiments, the function layer includes: an LED structure, and a light emission wavelength of the LED structure is less than 350 nm.

In some embodiments, the substrate includes a flat structure, and the first AlN layer includes a patterned structure: or both the substrate the and the first AlN layer include a patterned structure.

Compared with the prior art, the present disclosure has the following beneficial effects:
  1) in the present disclosure, on the one hand, the first AlN layer and the first AlGaN layer respectively correspond to a nucleation layer and a buffer layer when the function layer is epitaxially grown, to improve the quality of the function layer; and on the other hand, when the substrate is irradiated with laser light in certain bands, the first AlN layer is transparent to the laser light in the bands, but the first AlGaN layer decomposes into nitrogen after absorbing the laser light in the bands, causing the first AlGaN layer to be loose and porous and easy to separate, such that the substrate can be easily peeled off without damaging the function layer.
  2) in some embodiments, there is a) a second AlN layer or b) a second AlGaN layer between the first AlGaN layer and the function layer, and the Al composition content in the second AlGaN layer is greater than the Al composition content in the first AlGaN layer. Compared with the solution b), the solution a) can improve the decomposition degree of the first AlGaN layer, and the peeling effect is better. Compared with the solution a), the solution b) can improve the quality of the function layer.
  3) in some embodiments, the first AlGaN layer is a stacked structure, and the stacked structure includes multiple first AlGaN sublayers, and the Al composition content in each of the first AlGaN sub-layers is different. Compared with the solution in which the first AlGaN layer has a single-layer structure and the composition content of Al is fixed, the advantage of multiple first AlGaN sublayers is that the applicable laser wavelength range for peeling is large, or when the laser wavelength drifts, there is still a good peeling effect.

Figure 1:
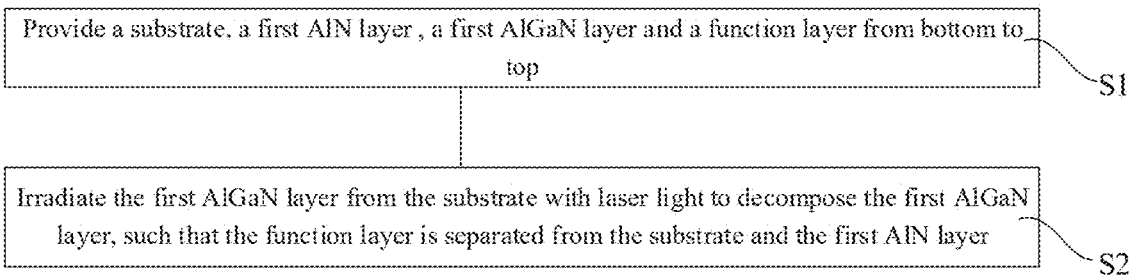
FIG. 1 is a flowchart of a method for peeling off a substrate of a semiconductor structure according to a first embodiment of the present disclosure.

To facilitate the understanding of the present disclosure, all reference signs present in the present disclosure are listed below:

substrate 10
first AlN layer 11
first AlGaN layer 12
reacted first AlGaN layer 12'
function layer 13
first AlGaN sublayer 121, 122
second AlGaN layer 14
second AlN layer 15

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

Figure 2:
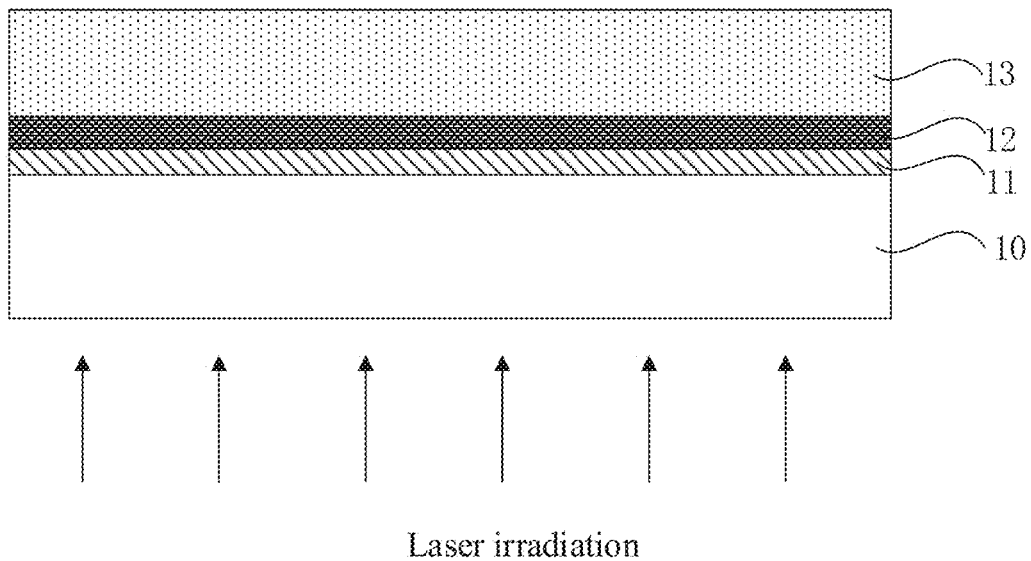
FIG. 2 and FIG. 3 are schematic diagrams of intermediate structures corresponding to processes in FIG. 1.
Figure 3:
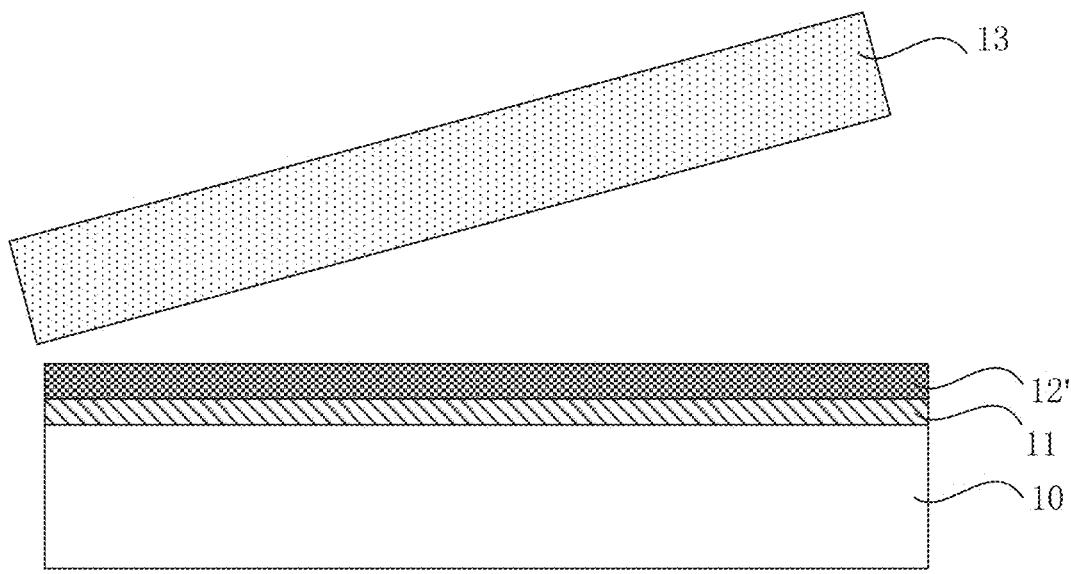

FIG. 1 is a flowchart of a method for peeling off a substrate of a semiconductor structure according to a first embodiment of the present disclosure; and FIG. 2 and FIG. 3 are schematic diagrams of intermediate structures corresponding to processes in FIG. 1.

First, referring to step S1 in FIG. 1 and as shown in FIG. 2, a substrate 10, a first AlN layer 11, a first AlGaN layer 12 and a function layer 13 are provided from bottom to top.

A material of the substrate 10 may be a material such as sapphire, silicon carbide, silicon or diamond, preferably a material with high transmittance to laser light used in the subsequent step S2.

A material of the function layer 13 may be a group III nitride-based material, such as at least one of GaN, AlGaN, InGaN, and AlInGaN. The function layer 13 may correspond to a heterojunction structure in the HMET (High Electron Mobility Transistor) device, that is, the function layer 13 may include: a barrier layer and a buffer layer: or the function layer 13 may correspond to an LED structure in an LED device, that is, the function layer 13 may include: a P-type semiconductor layer, an N-type semiconductor layer and a single quantum well layer/a multiple quantum well layer/quantum dots/quantum wires between the P-type semiconductor layer and the N-type semiconductor layer.

In an embodiment, a light emission wavelength of the LED structure may be less than 350 nm.

In another embodiment, the LED structure can function with a pair of Bragg mirrors as a light wave filtering structure.

It should be noted that, in the embodiments, a material is represented by chemical elements, but a molar ratio of each chemical element in the material is not limited. For example, the GaN material contains Ga element and N element, but the molar ratio of Ga element and N element is not limited.

The first AlN layer 11 can serve as a nucleation layer when epitaxially growing the function layer 13. The nucleation layer can alleviate the problems of lattice mismatch and thermal mismatch between the epitaxially grown function layer 13 and the substrate 10.

The first AlGaN layer 12 can serve as a buffer layer when epitaxially growing the function layer 13. The buffer layer can reduce the dislocation density and defect density of the epitaxially grown function layer 13 and improve the crystal quality.

In this embodiment, the first AlGaN layer 12 includes a single-layer structure, and a material of the single-layer structure may be represented as AlGaN.

Next, referring to step S2 in FIG. 1 and as shown in FIG. 2 and FIG. 3, the first AlGaN layer 12 is irradiated from the substrate 10 with laser light to decompose the first AlGaN layer 12, such that the function layer 13 is separated from the substrate 10 and the first AlN layer 11.

When the substrate 10 is irradiated by laser light in certain wavelength bands, the first AlN layer 11 is transparent to the laser light in the wavelength bands, but the first AlGaN layer 12 will decompose into nitrogen gas after absorbing the laser light in the wavelength bands, and the reacted first AlGaN layer 12' is loose, porous and easy to be separated, such that the substrate 10 can be easily peeled off without damaging the function layer 13.

Research shows that, in the first AlGaN layer 12, the Al composition content is less than 70%, that is, when the percentage of the content of Al element in the first AlGaN layer 12 to the sum of the contents of Al element and Ga element is less than 70%, correspondingly the wavelength range of the laser light with better decomposition degree is from 200 nm to 300 nm. Further, when the percentage of the content of Al composition in the first AlGaN layer 12 is less than 40%, the wavelength range of the laser light being from 250 nm to 280 nm has better the decomposition degree.

Sapphire has a high transmittance in the above-mentioned 200 nm-300 nm wavelength band, and can be used as a preferred material for the substrate 10.

It should be noted that, in this embodiment, the range includes endpoint values.

Figure 4:
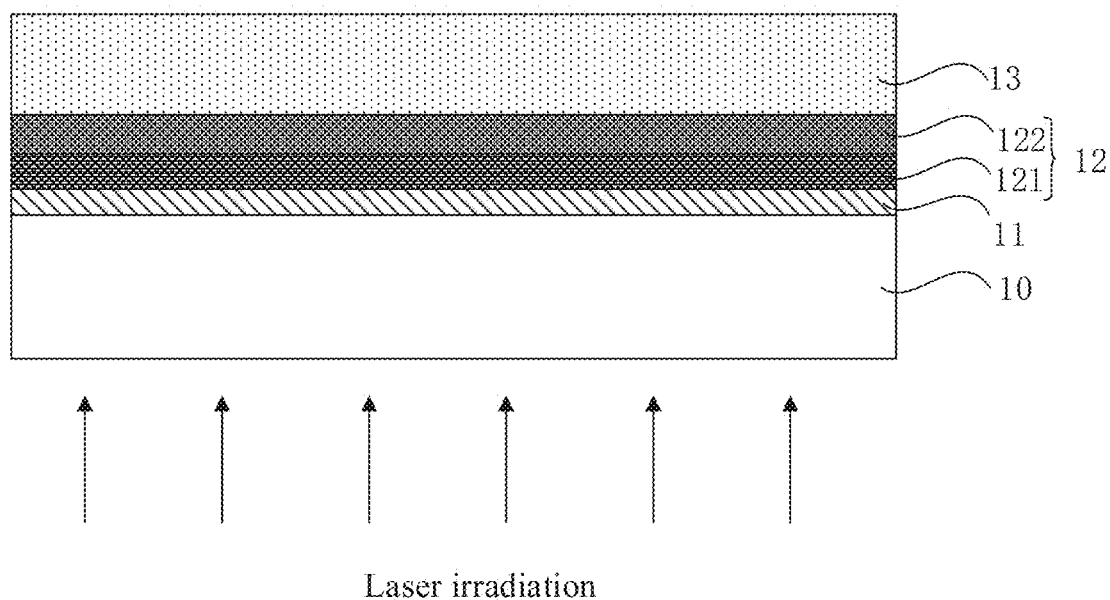
FIG. 4 is a schematic diagram of an intermediate structure corresponding to a method for peeling off a substrate of a semiconductor structure according to a second embodiment of the present disclosure.

FIG. 4 is a schematic diagram of an intermediate structure corresponding to a method for peeling off a substrate of a semiconductor structure according to a second embodiment of the present disclosure.

Referring to FIG. 4, the method for peeling off the substrate according to the second embodiment is substantially the same as the method for peeling off the substrate according to the first embodiment, the difference is that the first AlGaN layer 12 is a multi-layer structure, the multi-layer structure includes multiple first AlGaN sublayers 121 and 122, and the Al composition content in each of the first AlGaN sublayers 121 and 122 is different.

Compared with the solution in which the first AlGaN layer 12 is a single-layer structure and the Al composition content is fixed, the advantage of the solution for multi-layer structure is that the applicable laser light wavelength range for peeling is large, or when the laser light wavelength drifts, there is still a good peeling effect. In addition, the multi-layer structure of the first AlGaN layer can also protect the upper function layer 13.

In some embodiments, the multi-layer structure may further include: AlGaN/AlN alternating multi-layer superlattice structure. In the superlattice structure, the Al composition content in each of the AlGaN layers is different or the same.

Figure 5:
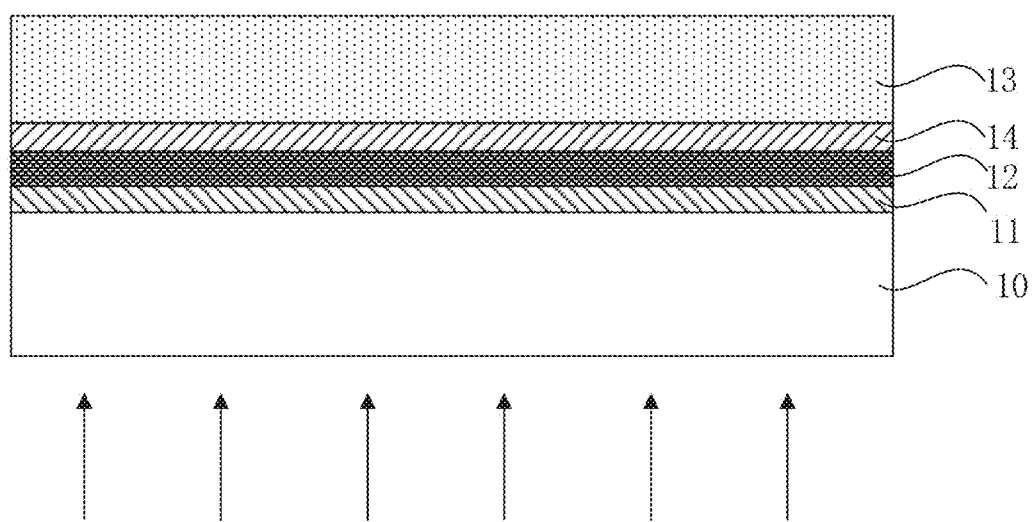
FIG. 5 is a schematic diagram of an intermediate structure corresponding to a method for peeling off a substrate of a semiconductor structure according to a third embodiment of the present disclosure.

FIG. 5 is a schematic diagram of an intermediate structure corresponding to a method for peeling off a substrate of a semiconductor structure according to a third embodiment of the present disclosure.

Referring to FIG. 5, the method for peeling off a substrate according to the third embodiment is substantially the same as the method for peeling off a substrate according to the first and second embodiments, and the difference is that a second AlGaN layer 14 is provided between the first AlGaN layer 12 and the function layer 13, where the Al composition content in the second AlGaN layer 14 is higher than the Al composition content in the first AlGaN layer 12; and after the laser light irradiates the first AlGaN layer 12 from the substrate 10, the function layer 13 and the second AlGaN layer 14 are separated from the substrate 10 and the first AlN layer 11.

The laser light can pass through the first AlN layer 11 and cannot pass through the first AlGaN layer 12. In some embodiments, the laser light can pass through both the first AlN layer 11 and the second AlGaN layer 14, and cannot pass through the first AlGaN layer 12, such that the damage of the second AlGaN layer 14 by the laser light can be avoided.

The higher the Al content in the AlGaN layer, the better the quality of the function layer 13, so the solution of this embodiment can improve the quality of the function layer 13.

Figure 6:
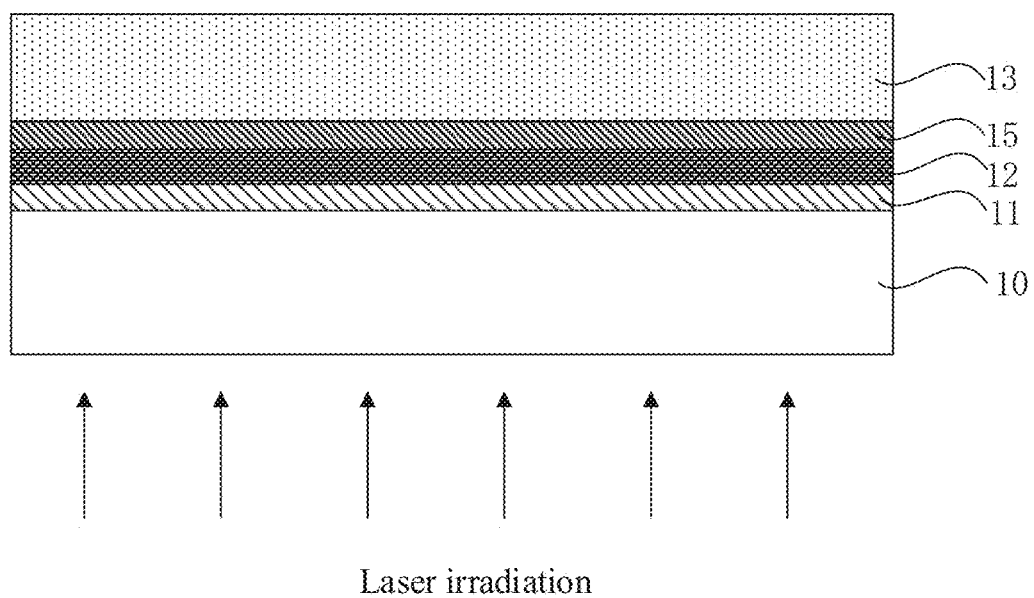
FIG. 6 is a schematic diagram of an intermediate structure corresponding to a method for peeling off a substrate of a semiconductor structure according to a fourth embodiment of the present disclosure.

FIG. 6 is a schematic diagram of an intermediate structure corresponding to a method for peeling off a substrate of a semiconductor structure according to a fourth embodiment of the present disclosure.

Referring to FIG. 6, the method for peeling off a substrate according to the fourth embodiment is substantially the same as the method for peeling off a substrate according to the third embodiment, and the difference is that a second AlN layer 15 is provided between the first AlGaN layer 12 and the function layer 13; and after the laser light irradiates the first AlGaN layer 12 from the substrate 10, the function layer 13 and the second AlN layer 15 are separated from the substrate 10) and the first AlN layer 11. In other words, the second AlN layer 15 replaces the second AlGaN layer 14.

Compared with the solution in the third embodiment, in this solution the thickness of the AlGaN layer is reduced, so under the same laser power, the decomposition degree of the first AlGaN layer 12 can be improved, and the peeling effect is better.

In some embodiments, the methods for peeling off a substrate according to embodiments 1 to 4 can also be applied to a patterned substrate.

For example, in an embodiment, the substrate 10 includes a flat structure, and the first AlN layer 11 includes a patterned structure.

In another embodiment, both the substrate 10 and the first AlN layer 11 include a patterned structure. For example, the substrate 10 and the first AlN layer 11 are patterned in the same process; or the substrate 10 is patterned first, the first AlN layer 11 is epitaxially grown on the patterned substrate 10.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A method for stripping a substrate of a semiconductor structure, comprising:
    providing a substrate, a first AlN layer, a first AlGaN layer and a function layer from bottom to top; and
    irradiating the first AlGaN layer from the substrate with laser light to decompose the first AlGaN layer, such that the function layer is separated from the substrate and the first AlN layer,
    wherein the substrate comprises a flat structure, and the first AlN layer comprises a patterned structure;
    wherein the first AlGaN layer is a multi-layer structure; wherein the multi-layer structure comprises an AlGaN/AlN alternating multi-layer superlattice structure, wherein in the superlattice structure, Al composition content in each of AlGaN layers is different.

2. The method according to claim 1, further comprising:
    providing a second AlN layer between the first AlGaN layer and the function layer, wherein after the laser light irradiates the first AlGaN layer from the substrate, the function layer and the second AlN layer are separated from the substrate and the first AlN layer.

3. The method according to claim 1, further comprising:
    providing a second AlGaN layer between the first AlGaN layer and the function layer, wherein Al composition content in the second AlGaN layer is higher than Al composition content in the first AlGaN layer, and after the laser light irradiates the first AlGaN layer from the substrate, the function layer and the second AlGaN layer are separated from the substrate and the first AlN layer.

4. The method according to claim 1, wherein Al component content in the first AlGaN layer is less than 70%.

5. The method according to claim 1, wherein a material of the substrate is sapphire.

6. The method according to claim 1, wherein the function layer comprises: a light wave filtering structure or an LED structure.

7. The method according to claim 1, wherein the function layer comprises: an LED structure, and a light emission wavelength of the LED structure is less than 350 nm.

* * * * *